United States Patent
Dukart et al.

[11] Patent Number: 5,880,586
[45] Date of Patent: Mar. 9, 1999

[54] APPARATUS FOR DETERMINING ROTATIONAL POSITION OF A ROTATABLE ELEMENT WITHOUT CONTACTING IT

[75] Inventors: Anton Dukart, Woerth; Hermann Winner, Karlsruhe; Siegbert Steinlechner, Leonberg; Erich Zabler, Stutensee, all of Germany

[73] Assignee: Robert Bosch GmbH, Stuttgart, Germany

[21] Appl. No.: 682,642

[22] PCT Filed: Nov. 22, 1995

[86] PCT No.: PCT/DE95/01626

§ 371 Date: Jul. 22, 1996

§ 102(e) Date: Jul. 22, 1996

[87] PCT Pub. No.: WO96/16316

PCT Pub. Date: May 30, 1996

[30] Foreign Application Priority Data

Nov. 22, 1994 [DE] Germany ............ 44 41 504.4

[51] Int. Cl.⁶ ............. G01B 7/30; G01R 33/06
[52] U.S. Cl. ............. 324/207.2; 324/207.21; 324/207.25
[58] Field of Search ............ 324/207.2, 207.21, 324/207.23, 207.25, 251, 160, 163, 165, 173–175, 252; 338/32 R, 32 H; 327/3; 702/145; 340/670–672

[56] References Cited

U.S. PATENT DOCUMENTS 4,791,366  12/1988  Suzuki et al. ............ 324/207.2

FOREIGN PATENT DOCUMENTS 0 217 478 B1  7/1991  European Pat. Off. .
9302758  11/1994  Germany .
56-143905  11/1981  Japan .
60-031005  2/1985  Japan .
61-274508  12/1986  Japan .

OTHER PUBLICATIONS

"Simulation, Design and Fabrication of a Vertical Hall Device for Two–Dimensional Magnetic Field Sensing", By M. Paranjape, Lj. Ristic and W. Allegretto, Sensors and Materials, 5,2 (1993) 091–101, MYU, Tokyo.

"Neue, alternative Loesungen fuer Drehzahlsensoren im Kraftfahrzeug auf magnetoresistiver Basis", by E. Zabler and F. Heintz, VDI–Berichte, Nr. 509, 1984.

Eijkel et al., A Thin Film Magnetoresistive Angle Detector, Sensors and Actuators, A21–A23, 1990, pp. 795–798.

Primary Examiner—Jay M. Patidar
Attorney, Agent, or Firm—Michael J. Striker

[57] ABSTRACT

The apparatus for determining rotational position of a rotatable element without contacting it includes a sensor device having two Hall or AMR sensor elements for sensing a magnetic field of magnetic field strength (B) generated by or influenced by the rotational position of the rotatable element and for producing output signals according to the magnetic field and thus the rotational position of the rotatable element. In order to easily detect the absolute rotational position of the rotatable element, the sensor device is constructed and positioned with respect to the rotatable element so that in every rotational position the field lines from the rotatable element extend at right angles to the sensor structures defined by the direction of an alternating current in the sensor elements. Using different embodiments of an electronic evaluation circuit, the direction components of the magnetic field are evaluated to determine the rotational position by comparing the input current to one of the sensors and the sum of the output signals of the respective sensor elements. Either sinusoidal or rectangular alternating voltages or direct voltages are input to the sensor elements.

16 Claims, 8 Drawing Sheets

APPARATUS FOR DETERMINING ROTATIONAL POSITION OF A ROTATABLE ELEMENT WITHOUT CONTACTING IT

BACKGROUND OF THE INVENTION

1. Field of the Invention

The invention relates to an apparatus for determining rotational position of a rotatable element, especially a rotating shaft in a motor vehicle, without contacting it and, more particularly, to an apparatus for determining rotational position that includes a sensor device having Hall or AMR sensor elements for sensing a magnetic field of magnetic field strength (B) generated by or influenced by the rotational position of the rotatable element and for producing output signals according to the magnetic field and thus the rotational position of the rotatable element.

2. Prior Art

An apparatus of this type, with which detection of the angle of rotation can be carried out, is known from EP-O 217 478 B1, for example. Here the magnetic field lines issuing from a rotating magnet are detected and evaluated by an angle sensor, which is formed from two parallel thin films of magnetically soft material. The magnetic films in the angle sensor are mounted such that in the plane of the field lines power supply connections and voltage measuring connections, respectively, are staggered by 45° and connected to the two films. Due to resistance anisotropy in the films the result is a sensor signal dependent on the direction of the angular position of the field lines, a signal that can be processed in an evaluation circuit. In this known configuration, however, angle determination can take place only in the range of 180°, which results in higher cost for proper detection of the angular position.

Sampling of incremental structures on gear wheels made of ferromagnetic material is also known, where sampling is carried out using contactless sensor configurations, for ignition control in internal combustion engines or for speed detection for anti-lock systems, for example. An article in VDI-Bericht, No. 509 (VDI-Verlag 1984), Pages 263 to 268, entitled "Neue, alternative Lösungen für Drehzahlsensoren im Kraftfahrzeug auf magnetoresistiver Basis" [New Alternative Solutions for Magnetoresistive-Based Speed Sensors in Motor Vehicles], for example, describes how sampling of incremental structures on rotating shafts or gear wheels in a manner that is especially simple and particularly insensitive to air-gap fluctuations can be carried out using magnetic tangential probes as sensors. This is possible because the sign of the tangential component of a permanent magnet located in the sensor is not a function of the size of the air gap between the sensor and the rotatable elements. A change in this sign can only be effected by a further rotor-like movement of the shaft or gear wheel, by which means an incremental change in the angle of rotation of a gear wheel can be detected.

The known publication cited above also describes the use of sensors that utilize the "Hall effect" for sampling a change in a magnetic field on page 264 in section 3.3. These Hall sensors, the design of which is known, utilize deflection of a current flowing between two connection poles brought about by a magnetic field positioned perpendicular to it. In this case a charge carrier displacement in the direction of the magnetic field lines results in the development of "Hall voltage," which can be tapped at right angles to the current flow direction. Utilizing the properties of Hall structures in semiconductor materials that are optimum for this purpose, the current flow direction in this Hall structure generally runs coplanarly in the plane of a "semi-conductor wafer," for example a silicon semiconductor chip.

The tangential field detection necessary for sampling on rotatable elements is in this case disadvantageous, since as a result of the unavoidable tangential lengthening of the conventional type of Hall sensor, a considerable air gap between the rotatable element and the sensor results (approximately 2 mm to 4 mm) and the effect of the field lines running perpendicular to the wafer plane is sharply reduced. Since the field strength decreases exponentially in relation to the distance between the rotatable element and the sensor, the measurement effect that can be evaluated becomes very small in this case. In order to detect a signal that is not a function of the air gap using the known method, differential detection of the radially oriented field must be carried out with two Hall sensors that may also need to be adjusted, especially to the increment widths (tooth spacing in gear wheels). Use of materials having a higher sensitivity oriented in a different direction such as magnetoresistive thin-film sensors, permalloy sensors or even "pseudo-Hall sensors" as an alternative to silicon semiconductor Hall sensors is possible, but the manufacturing technology for these materials is expensive, particularly if they are to be connected to an amplifier circuit or integrated with it.

In addition, Hall sensors are known (from *Sensors and Materials*, 5.2 (1993) 091–101, MYU, Tokyo, the article "Simulation, Design and Fabrication of a Vertical Hall Device for Two-Dimensional Magnetic Field Sensing" by M. Parajape, Lg. Ristic and W. Allegretto) in which the Hall structure extends perpendicular to the wafer surface to the depth of a silicon chip. Thus in this case detection of the tangentially oriented field is possible without increasing the air gap to an intolerable degree.

These Hall sensors, as known from the second publication, require a small degree of expansion and consequently a very small air gap, which consists essentially of only the wafer thickness (approximately 400 $\mu$m) plus a protective coating. Detection of components of a two-dimensional magnetic field using two Hall sensors that are offset by 90° is also known from this publication.

SUMMARY OF THE INVENTION

It is an object of the present invention to provide an improved apparatus for determining rotational position of a rotatable element of the above-described kind that does not have the above-described disadvantages.

These objects, and others which will be made more apparent hereinafter, are attained in an apparatus for determining rotational position of a rotatable element without contacting it including a sensor device having at least two sensor elements for sensing a magnetic field of magnetic field strength (B) generated by the rotatable element or influenced by the rotation of the rotatable element and for producing output signals according to the magnetic field and thus the rotational position of the rotatable element.

According to the invention, the apparatus has an evaluation circuit means for evaluating the output signals of the sensors that comprises means for supplying the at least two sensor elements with respective alternating currents that are 90° out of phase in accordance with formulae Ia and Ib:

$$I_1 = I_o \cos(\omega t) \tag{Ia}$$

$$I_2 = I_o \sin(\omega t) \tag{Ib}$$

to produce respective output voltages ($U_{H1}$, $U_{H2}$) at said sensor outputs according to formulae IIa and IIb:

$$U_{H1} = C_1 B_1 \cos(K\alpha) I_1(t) \tag{IIa}$$

$$U_{H2} = C_2 B_2 \sin(K\alpha) I_2(t) \tag{IIb},$$

wherein t is time, ω is frequency in reciprocal time units, $I_o$ is a constant and is a maximum current value for $I_1$ and $I_2$, $C_1 = C_2 = C$ = another constant and $B_1 = B_2 = B$ = an additional constant magnetic field strength value, such that $C_1 B_1$ and $C_2 B_2$ are maximum voltage values and are equal, α is an angle of rotation of the rotatable element and K is a constant such that Kα is the phase factor; means (3) for summing the output voltages ($U_{H1}$, $U_{H2}$) to form a sum signal; and a phase comparator (25) for producing a rotational position signal proportional to the angle of rotation from the rotatable element from the sum signal and an alternating current supplied to one of the at least two sensor elements.

The configuration of the invention for contactless detection of the angle of rotation of a rotatable element, utilizing the Hall effect or a magnetoresistive effect, has the advantage that tangential field detection of a magnetic field generated or influenced by the rotatable element and having a small air gap, for example, is possible with a high degree of accuracy. Due to their smaller dimensions in the planar plane, the sensor elements, which are arranged vertically in a surface such as a silicon wafer, permit effective sensor placement in the vicinity of the rotatable element, whereby additional three-dimensional micromechanical structuring can increase the sensitivity of the sensor. In this case the electronic circuits required for signal conditioning can be advantageously integrated into the same silicon chip in which the sensor elements are located. In this case, as mentioned above, it is possible to avoid the disadvantage of an incremental angle-of-rotation measuring system that is based on an increment count that can be permanently destroyed from the outside.

By using two vertical Hall sensor elements rotationally offset by 90° or two AMR sensor elements rotationally offset by 45° on rotatable elements in accordance with the invention, two components of an external field located in the plane of the surface bearing the sensor elements can be detected easily and very precisely. In this case the rotational position of the rotatable element likewise changes the rotational position of the generated or influenced magnetic field and consequently the field components in the plane of the surface bearing the sensor elements. In the configuration of the invention therefore the absolute rotational position of the rotatable element can also be detected at any time and is not limited to increments. Electronic evaluation can be advantageously undertaken since the signals generated by the field components vary according to a sine or cosine law and determination of the rotational position value with analog or digital circuits can be carried out by converting trigonometric formulas using circuit engineering techniques. Such advantageous evaluation is possible if one of the sensor elements is excited by a sinusoidal signal and the other by a cosinusoidal signal. Especially advantageous is the fact that circuit-engineering conversion is suitable for the evaluation of signals from selectable sensors, whereby feed signals are combined with control signals in an appropriate way, especially multiplicatively.

If the sensor elements are triggered by suitable rectangular signals having an angular frequency ω, for example by two square-wave voltages having a 50% pulse duty factor and a phase difference of one-fourth of a period, then particular advantageous possibilities result. For example, such rectangular signals are simpler to generate than phase- and amplitude-constant sinusoidal or cosinusoidal signals. Moreover, no problems with the amplitude or phase constancy of these signals occur.

A ratiometric analog output voltage can easily be generated, or even a pulse-duration-modulated output signal, if desired. Zero shifts or calibrations as well as compensation of static sensor and/or evaluation circuit errors can be accomplished in analog or digital form, and the entire sensor and evaluation circuit configuration can be completely integrated.

The sensor temperature can be determined by measuring the current consumption during generation of rectangular signals; in this way advantageous compensation of temperature-dependent sensor properties is possible.

In another advantageous embodiment of the invention the two sensors are triggered by direct voltages, and the generated output voltage is processed by means of two electronic switches. A zero shift can also be compensated with an embodiment of this type.

Additional advantageous embodiments of the invention are given in the subclaims.

BRIEF DESCRIPTION OF THE DRAWING

The objects, features and advantages of the invention will now be illustrated in more detail with the aid of the following description of the preferred embodiments, with reference to the accompanying figures in which.

DESCRIPTION OF THE PREFERRED EMBODIMENTS

The invention shall be explained with reference to embodiments in which the sensor elements are two Hall sensors, for example. The invention can likewise be implemented using other magnetoresistive sensors, i.e., sensors whose resistance varies as a function of the magnetic field.

Figure 1:
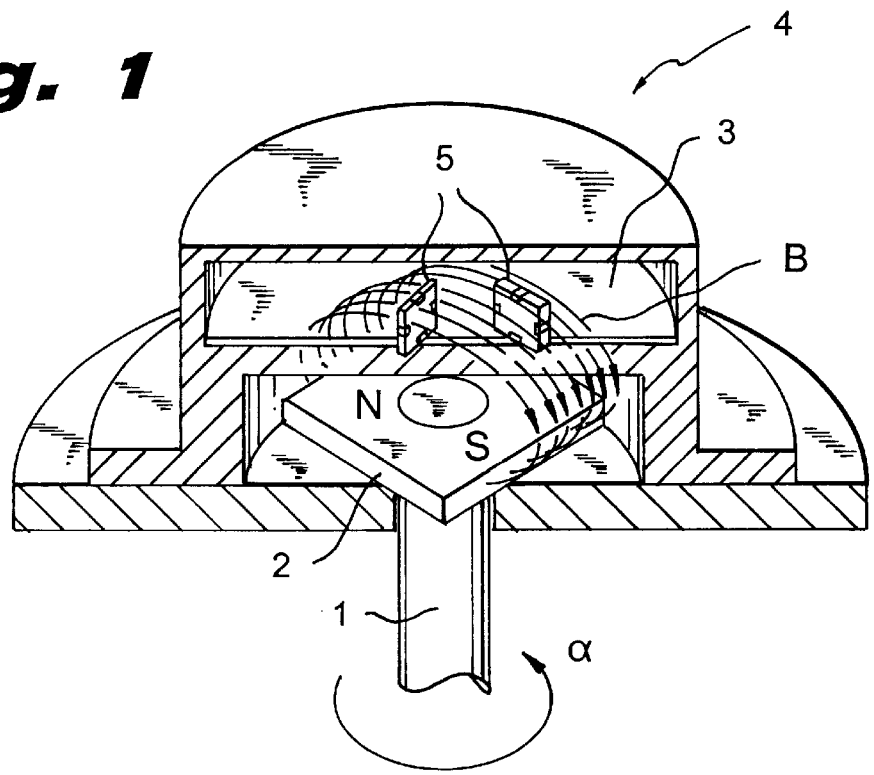
FIG. 1 is a partial cross-sectional, partially perspective view of an angle-of-rotation detection apparatus on a rotatable shaft with a schematic diagram of a sensor configuration.

FIG. 1 shows a shaft 1 that can rotate by the angle α and carries at its end a permanent magnet 2 as an element that can rotate along with it. α is the angle that is to be measured. The magnetic field lines B of the magnet 2 run in this case through an upper section 3 of a housing 4, whereby in this upper section 3 a sensor configuration 5, comprising two Hall sensors offset by 90° (cf. FIG. 2), is permanently installed. The representation of the Hall sensors is in this case only schematic, since they can be integrated into a coating and thus no longer need to appear visibly. The directional components of the field lines in this case cause specific output signals from the two Hall sensors, by which means both the absolute rotational position and a change in the rotational position by any angle variation α can be evaluated using the electronic circuit described with reference to FIGS. 4 to 10.

Figure 2:
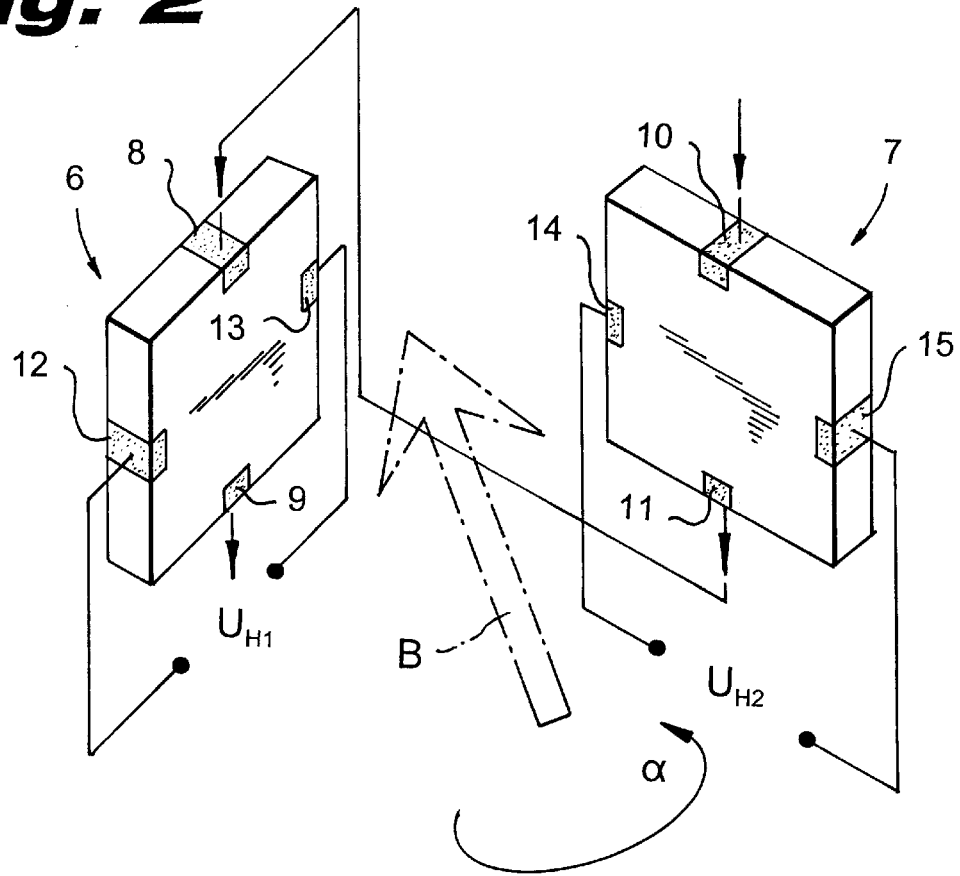
FIG. 2 is a perspective view of the sensor configuration of FIG. 1 with two Hall sensors offset by 90°.

In FIG. 2 the position and the interconnection of two Hall sensors 6 and 7, which form part of sensor configuration 5 of FIG. 1, is shown three-dimensionally and schematically. Hall sensor 6 has current connections 8 and 9 and Hall sensor 7 has current connections 10 and 11, through which a current I flows in the direction indicated. At right angles to the current flow direction of current I the Hall voltages $U_{H1}$ and $U_{H2}$ can be tapped at connections 12 and 13 (Hall sensor 6) and at connections 14 and 15 (Hall sensor 7). In this figure the magnetic field lines B of a magnet 2 (cf. FIG. 1) in the section between the opposite connections 12 and 13 and between connections 14 and 15, respectively, indicate field components that lead to a deflection of the charge carriers of current I in the manner known as the Hall effect. The associated potential difference leads to the Hall voltage $U_{H1}$ between poles or connections 12 and 13 and the Hall voltage $U_{H2}$ between poles or connections 14 and 15, which can be evaluated in the manner described below. A change in the direction of the field lines B due to rotation by the angle α accordingly results in the fact that the Hall effect in Hall sensors 6 and 7 is influenced differently. This can be used to calculate the angle of rotation α by way of electronic evaluation of the Hall voltages $U_{H1}$ and $U_{H2}$.

The two Hall sensors 6 and 7 can therefore be used for evaluation of a magnetic field generated by the rotatable element (magnet 2) in the full 360° range of rotation. For example, Hall sensors 6 and 7 are produced by vertical Hall structures inserted in a silicon semiconductor wafer such that due to their small dimensions in the wafer's planar plane a precise and virtually point-shaped placement of the sensor configuration 5 in the vicinity of the rotatable element is possible, and the sensitivity of the sensor configuration 5 can be increased by means of additional three-dimensional micromechanical structuring. The electronic circuits required for signal conditioning can in this case be advantageously integrated into the same silicon chip as Hall sensors 6 and 7.

Figure 3:
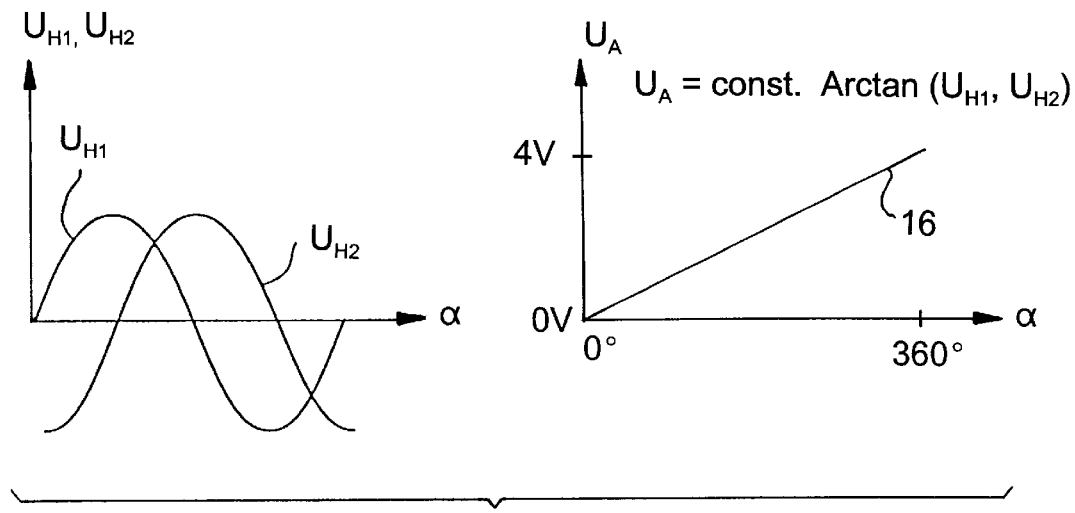
FIG. 3 is a graphical illustration of the dependence of the sensor output voltages and the resulting output signals on angle of rotation.

FIG. 3 shows the curve of Hall voltage $U_{H1}$ and Hall voltage $U_{H1}$ as a function of the angle of rotation α. Here the curve of Hall voltage $U_{H1}$ as a function of the angle of rotation α follows a sine law and the curve of Hall voltage $U_{H2}$ follows a cosine law, and this results in the following mathematical relations:

$$U_{H1} = C_1 \times I_1 \times B \times \cos\alpha, \qquad (1)$$

$$U_{H2} = C_2 \times I_2 \times B \times \sin\alpha, \qquad (2)$$

where $U_{H1}$ is the Hall voltage of the Hall sensor 6, $U_{H2}$ is the Hall voltage of the Hall sensor 7 that is offset by 90°, $C_1$ and $C_2$ are material constants of Hall sensors 6 and 7, B is the magnetic field strength that is perpendicular to the plane of the Hall sensors 6 and 7 (under the condition that the field strength at both Hall sensors 6 and 7 is identical (B1=B2)), and α is the angle of rotation of the rotating element (magnet 2).

Through combination of the Hall voltages $U_{H1}$ and $U_{H2}$, to be brought about in an electronic evaluation circuit, an output voltage $U_A$ is produced, which in very good approximation is proportional to the angle of rotation α of the rotatable element 2 (cf. shape of the curve 16 in the righthand portion of FIG. 3). With an appropriate circuit configuration mathematical evaluation can be carried out as follows, for example:

$$\alpha = \arctan(U_{H1}/U_{H2}) \qquad (3),$$

by which the angle of rotation α can be determined from the output voltage $U_A$ in the evaluation circuit.

Figure 4:
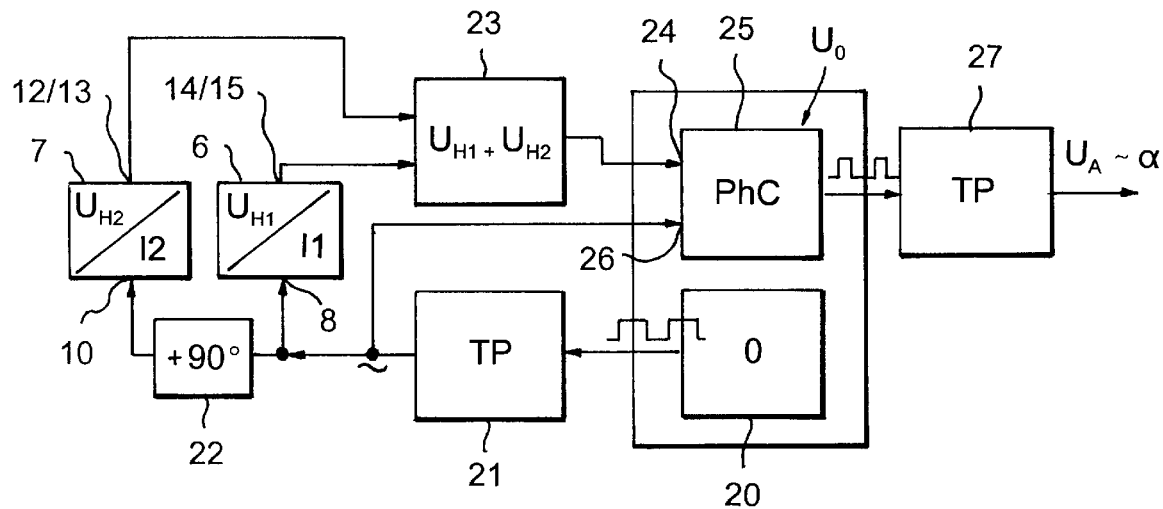
FIG. 4 is a block diagram of an evaluation circuit for determination of the angle of rotation of the rotatable shaft.

FIG. 4 shows as an example a possible embodiment of an evaluation circuit with which the above described angle-of-rotation evaluation can be carried out on the configuration of the invention. Starting with a voltage-regulated oscillator 20 having a low-pass filter 21 downstream, an initial sinusoidal alternating current $I_1$ is then generated, and this current is applied to the current connection 8 of the sensor and has the following time function:

$$I_1(t) = I_O \times \sin(\omega \times t).$$

A current $I_2$ that is out of phase by 90° and has the time function $$I_2(t) = I_O \times \cos(\omega \times t)$$

is applied to the output of a phase delay member 22, and this current is applied to the sensor at its current connection 10. The sensor elements then form a product; the voltages $V_{H1}$ and $V_{H2}$, at outputs 12/13 and 14/15, are obtained as follows:

$$U_{H1}(t,\alpha) = C_1 \times B_1 \times \cos(K\alpha) \times I_1(t)$$

and $$U_{H2}(t,\alpha) = C_2 \times B_2 \times \sin(K\alpha) \times I_2(t),$$

where the constants can be $C_1 = C_2 = C$ and the field components $B_1 = B_2 = B$. α is the angle to be measured, i.e., the angle between the control magnet field and the sensor. The factor K is 1 for Hall sensors and 2 for AMR sensors. Addition of these signals results in a voltage V(t) that is out of phase by Kα with respect to current $I_1$ or $I_2$. In a summing circuit 23 the sum of the two voltages $U_{H1}(t)$ and $U_{H2}(t)$ is formed, so that the result according to the following relation and by applying trigonometric formulas is a voltage V(t):

$$V(t) = U_{H1}(t) + U_{H2}(t)$$

$$V(t) = C \times B \times I_O \times (\cos(K\alpha) \times \sin(\omega \times t) + \sin(K\alpha) \times \cos(\omega \times t)).$$

This equation can be transformed into:

$$V(t) = C \times B \times I_O \times \sin(\omega \times t + K\alpha),$$

since in general the following is true:

$$\sin(a+b) = \sin(a) \times \cos(b) + \sin(b) \times \cos(a).$$

The voltage V(t) is applied to an initial input 24 of a phase comparator 25, to whose second input 26 the output signal (V=const×sin(ω×t)) of the low-pass filter 21 is applied. The output signal of the phase comparator 25 in this case represents a square-wave voltage having the pulse height $U_O$, in accordance with the supply voltage of the phase comparator 25. The pulse duration of the rectangular signal corresponds to the phase difference Kα between the two input voltages, which is proportional to the geometric angle of rotation α that is to be measured. The rectangular signal is smoothed by means of an additional low-pass filter 27 and thus yields the output signal $V_O$, which is proportional to the angle of rotation α of the rotatable shaft 1 shown in FIG. 1.

Therefore a phase comparison of i and V(t) is ultimately carried out and results in the pulse-duration-modulated voltage that is transformed by a low-pass filter into an analog voltage.

Instead of the phase shift of the current, a voltage downstream from the sensor element can also be out of phase by 90°.

The core of the invention is therefore ultimately the utilization of $\sin(a+b)=\sin(a)\times\cos(b)+\sin(b)\times\cos(a)$ for evaluation of the signals from sensors that combine supply signals with control signals multiplicatively so that the above expression results.

If the two sensor elements are not triggered by sinusoidal signals but by rectangular signals having the angular frequency $\omega$, then a favorable evaluation possibility results. The rectangular signals have a pulse duty factor of 50% and a phase difference of one-fourth of a period. Such rectangular signals can be generated very easily using flipflops, in which case the phase difference is exactly 90° and the amplitudes are identical. These properties, which are very important for measurement accuracy, can only be achieved in the case of analog sine or cosine signals at rather great cost. With triggering by rectangular signals the two sensor output signals are added in the same way as with triggering by sinusoidal or cosinusoidal signals. The resulting signal has angular frequency components at $\omega$, $3\omega$, $5\omega$, etc. Each of these angular frequencies has the phase $K\alpha$, $-K\alpha$, $K\alpha$, ... as compared with a sinusoidal signal having the corresponding angular frequency. In order for the phase to be measured, one angular frequency such as $\omega$ or $3\omega$ must be filtered out of the composite signal. This can be effected by a low-pass filter for the fundamental wave $\omega$ or by a bandpass filter for $3\omega$, after which the phase is measured by means of a phase comparator and an averaging low-pass filter, as already described in the embodiment with sinusoidal excitation.

Figure 5:
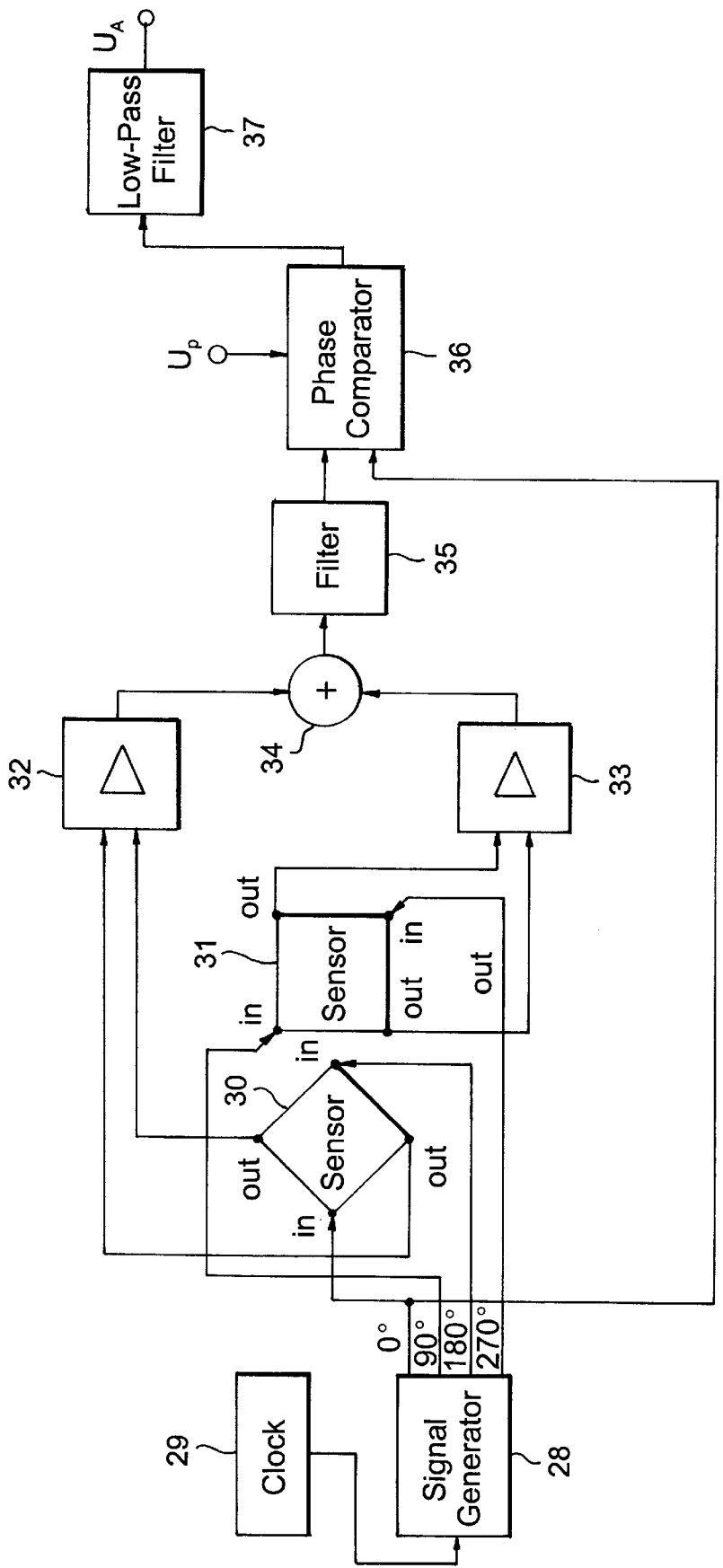
FIGS. 5 through 7 are block diagrams of embodiments for control systems involving rectangular signals.

In FIG. 5 an embodiment having 2 AMR sensor elements offset by 45° and rectangular signal excitation is shown in the form of a block diagram. A device for generating the rectangular signals 28, which in the simplest case comprises 2 delay flipflops, is controlled by a clock generator 29. The clock generator 29 generates a multiple, for example four times the desired rectangular angular frequency $\omega$. The rectangular signal generation thereby provides not only the 0° and the 90° signals with a 50% pulse duty factor but also their complements, i.e., 180° and 270°.

The two sensor elements 30 and 31, rotationally offset by an angle of 45°, are triggered by one push-pull signal each, which is supplied via the "in" inputs. Two downstream difference amplifiers 32 and 33 boost the sensor signals by a factor of 50, for example. The signals formed at the output of difference amplifiers 32 and 33 are added in the summing point 34. In the downstream filter 35 the added signal is filtered such that at the output of the filter 35 a sinusoidal output signal is formed, which is compared with the 0° signal in the phase comparator 36. For this purpose the voltage $U_p$ is also fed to the phase comparator 36.

The output signal produced by the phase comparator 36 is fed to a low-pass filter 37. Averaging is carried out in this low-pass filter. If the phase comparator 36 is operated with the externally supplied voltage $U_p$, then the output voltage of the low-pass filter 37 becomes proportional to the voltage $U_p$ and to the angle $K\alpha$. The output voltage $U_A$ at the output of the low-pass filter 37 then exhibits ratiometric behavior similar to the slider voltage in a potentiometer.

The zero stability of the described system shown in FIG. 5 is a function of the temperature sensitivity of the group delay time of the filter and the temperature sensitivity of the oscillator frequency. To reduce this temperature dependence, there are the following possibilities:

1. The temperature sensitivity of the oscillator is set equal to the temperature sensitivity of the group delay time. This can be achieved, for example, by means of identical components in the oscillator and in the filter. Most filter circuits can also be used as oscillators if the amplification is increased accordingly or a separate feedback is provided.

2. Construction of the filter based on switched-capacitor technology (SC technology) and clocking of the filter using the pulse generator. This possibility is represented in the embodiment shown in FIG. 6. The circuit configuration shown in FIG. 6 differs from the circuit configuration shown in FIG. 5 only in the fact that an additional connection exists between the clock generator 29 and the filter 35, which is designed as a SC filter.

Figure 6:
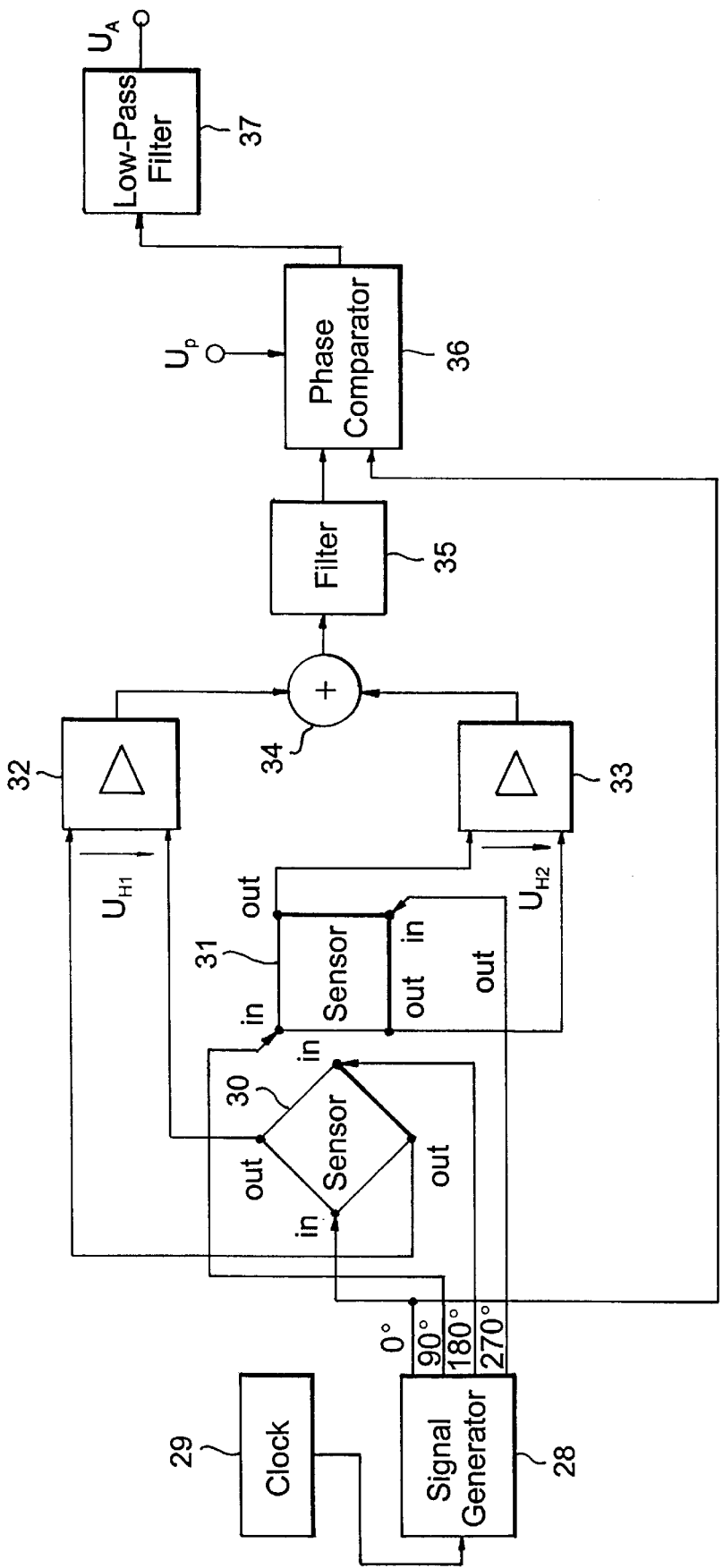

Since the limiting frequency of SC filters is a function only of the clock frequency and the clock frequency is a multiple of the rectangular frequency, the temperature sensitivity of the zero is virtually completely eliminated using the circuit configuration shown in FIG. 6.

Figure 7:
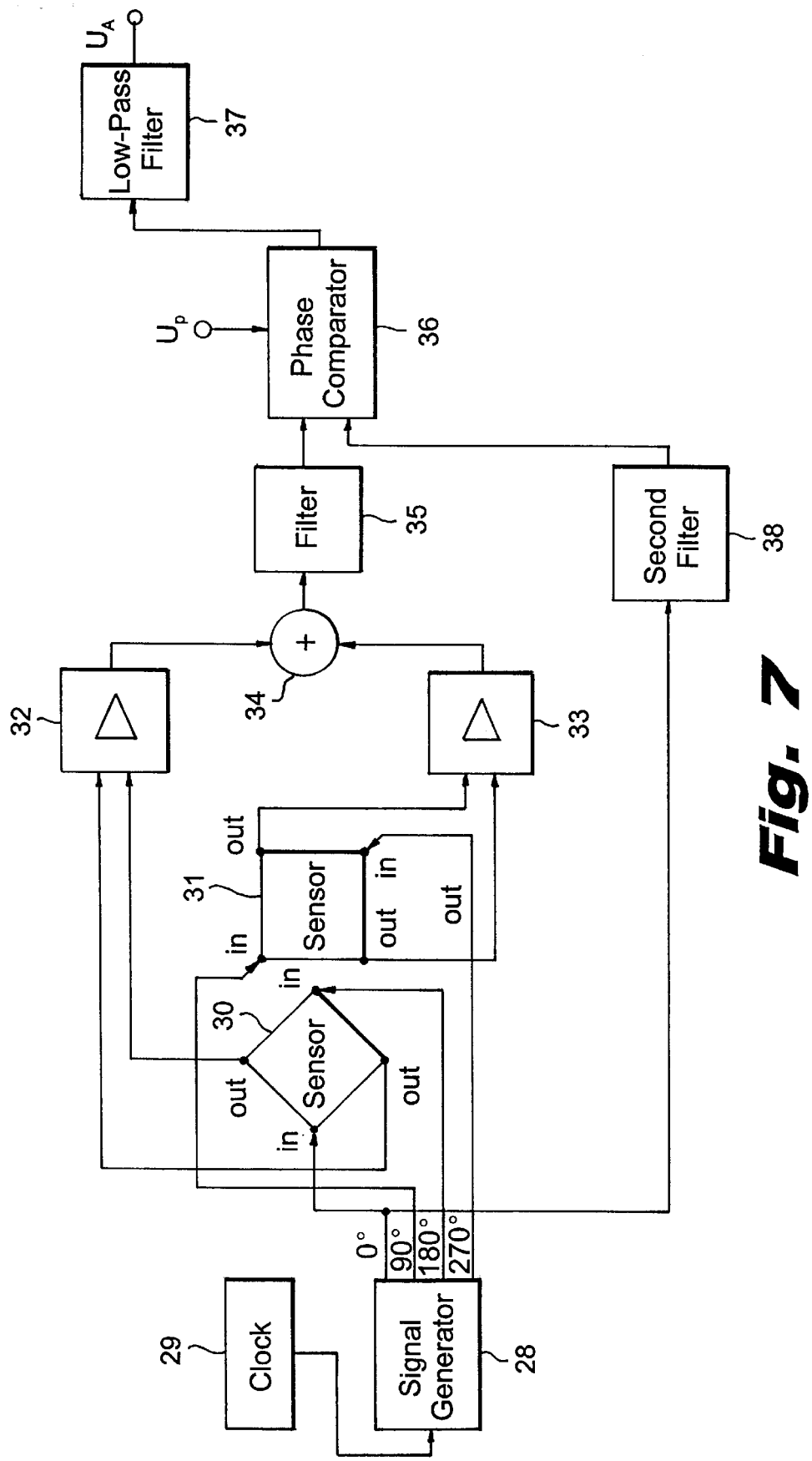

FIG. 7 shows another embodiment in which there is a second filter 38 that is located between the rectangular signal generating component 28 and the phase comparator 36. The zero-degree rectangular signal is fed to this filter 38. Filters 38 and 35 are identical filters, whereby filter 38 compensates for the temperature sensitivity of the group delay time of filter 35.

Figure 8:
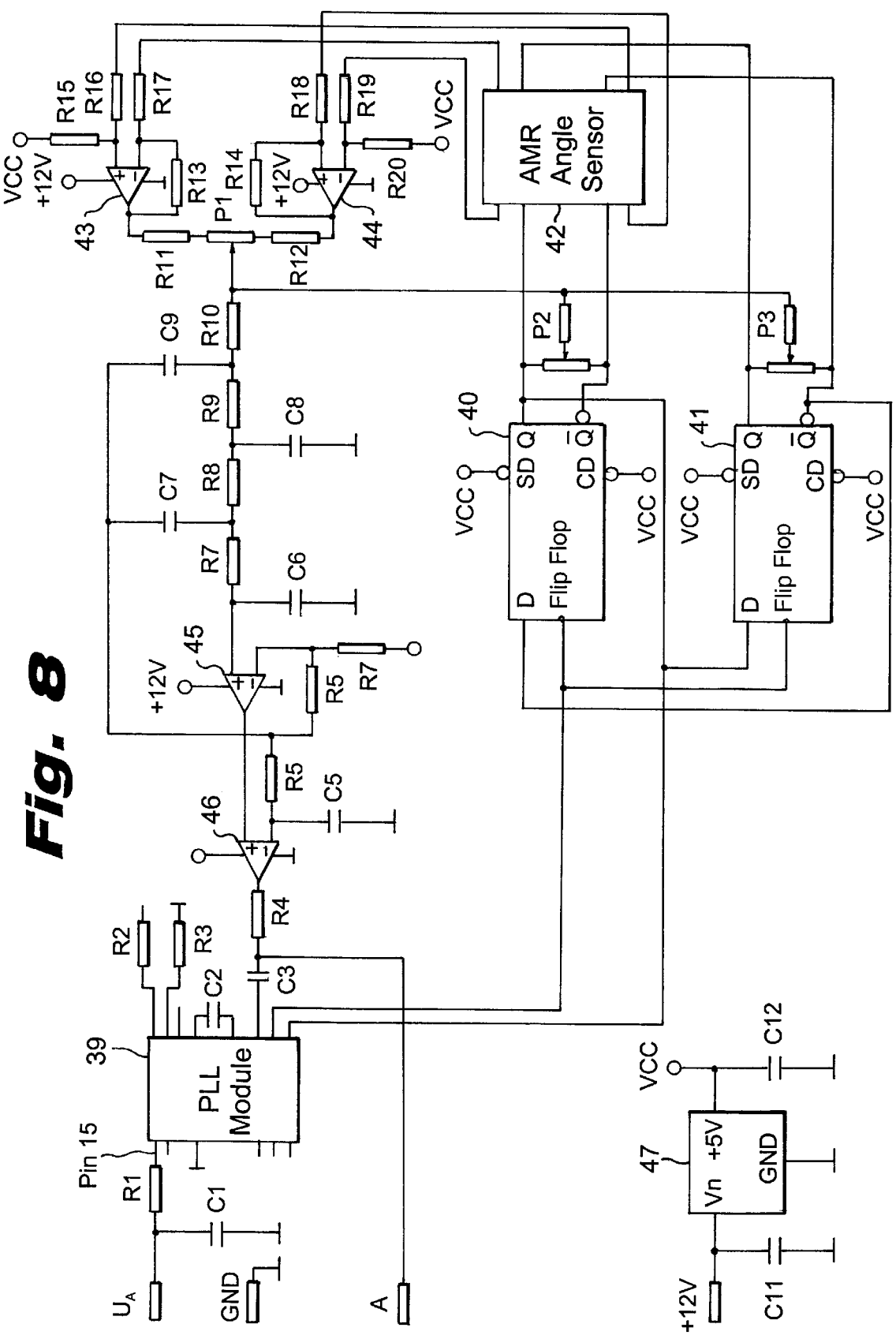
FIG. 8 is block diagram of a concrete circuit.

FIG. 8 shows a concrete evaluation circuit for a magneto-resistive angle sensor. The structure and function can be explained in detail as follows: a PLL module 39 contains the oscillator, which oscillates at 40 kHz, as well as the phase comparator. Two delay flipflops 40 and 41 form the rectangular signal generating component; the output frequency is 10 kHz. The complementary outputs are connected to the inputs of the AMR angle sensor 42, which comprises two sensor elements that are offset rotationally by 45°, as shown in FIGS. 5 to 7.

A double operational amplifier 43 and 44 acts as the difference amplifier. The sum of the two amplifier output signals reaches the Butterworth 4th-order low-pass filter having a limiting frequency of 10 kHz, which is formed by an operational amplifier 45 together with the associated wiring. An operational amplifier 46 configured as a comparator converts the sinusoidal output signal of the low-pass filter to a rectangular signal, which can be better processed by the phase comparator than a sinusoidal signal. The pulse-duration-modulated output signal can be tapped at Pin 15 of PLL module 39. A direct voltage $U_A$ proportional to the angle can be tapped at the analog low-pass output. The voltage supply of the entire circuit is indicated by 47.

Asymmetries in the sensors and in the difference amplifiers can be compensated by potentiometers P1, P2 and P3. P1 compensates amplitude errors between the two channels. P2 and P3 compensate sensor offset errors and crosstalk in the circuit. Replacement of the potentiometers by digitally adjustable networks is possible with circuit integration.

The resistors and capacitors present in the circuit and the necessary voltage supplies and ground connections are not identified in detail in the description; they are shown in the circuit example.

A digital zero balance can be achieved with the circuit configuration shown in FIG. 8. For this purpose a rough zero shift of 45°, 90° or 135° (from a mechanical standpoint) can be effected by feeding the 90°, 180° or 270° signal into the phase comparator instead of the 0° signal. A precision shift is possible by digital or analog delay of one of the two signals that reach the phase comparator. An analog shift can be effected by an all-pass filter, for example, which is advantageously designed using SC technology. The propagation delay time of this all-pass filter can be easily programmed digitally.

A digital shift can be effected by a programmable counter, for example, in which case a relatively high clock frequency must be used in the interest of precision quantization.

The present circuit configuration can also be used to carry out compensation of sensor properties, some of which are temperature-dependent. One temperature-dependent sensor property, for example, is the internal sensor resistance, which is generally a function of temperature. Since the sensor is operated with complementary rectangular signals of constant amplitude, its current consumption is constant over time but temperature-dependent. Since the CMOS flipflop module 40 or 41 has negligible current consumption at a clock frequency of 40 Khz, for example, the current that flows in the supply line of the flipflop is a direct measure of the current in the sensor and consequently of the sensor temperature. From measurement of the sensor's current consumption it is therefore possible to derive temperature-dependent correction signals, which act on the composite signal in just the same way as the potentiometers in FIG. 8.

Figure 9:
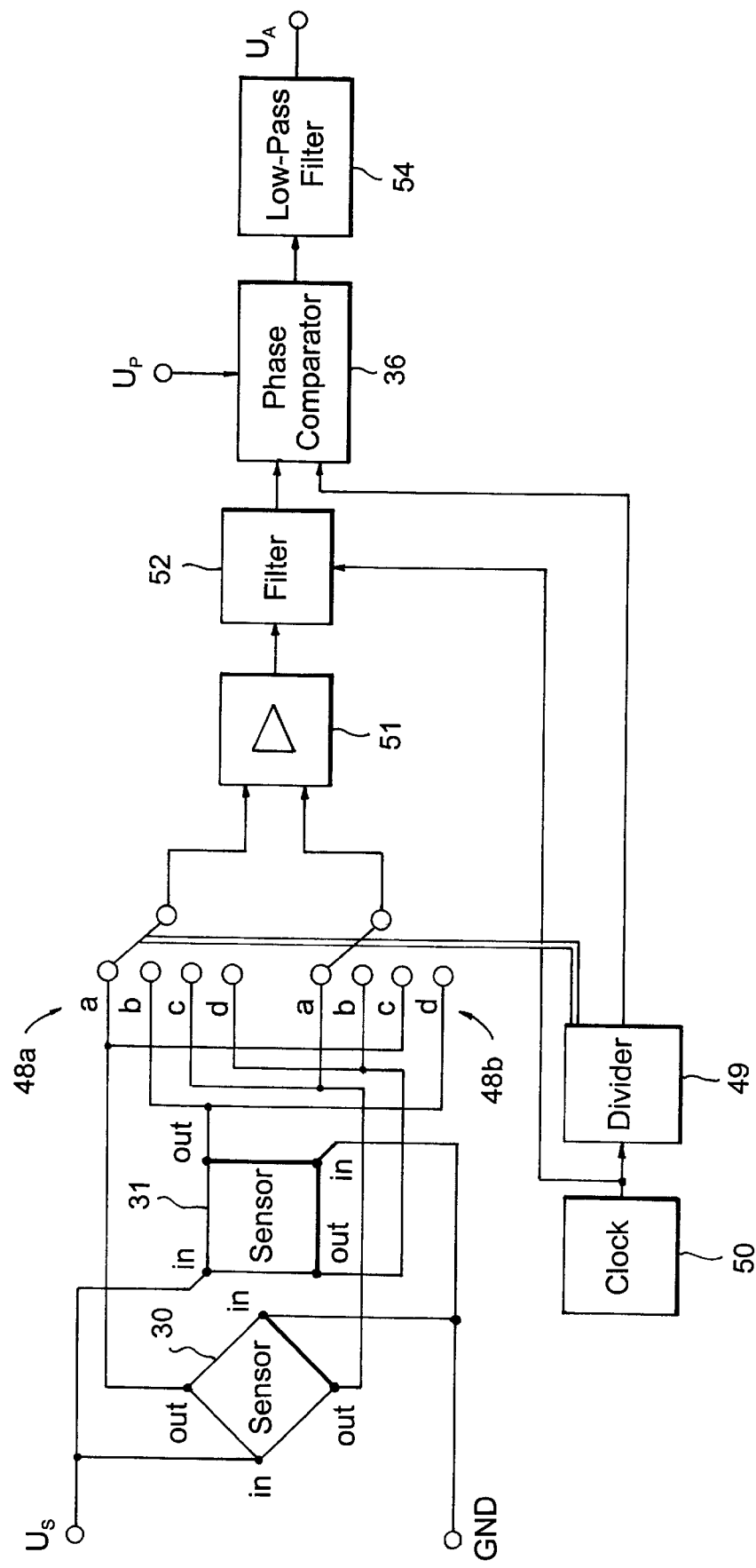
FIGS. 9 and 10 are block diagrams of embodiments in which the sensors are triggered by direct voltage and the output signals are processed by using switches.

FIG. 9 shows the block diagram of another embodiment of the invention. In this embodiment the sensor, which comprises the two sensor elements 30 and 31, is operated with direct voltage. The two sensor elements 30 and 31 are located in this case between the direct voltage $U_s$ and ground. The resulting output voltages at the two sensor elements 30 and 31 are obtained as:

$$V_{a1}(K\alpha) = C \times U_s \times \cos(K\alpha)$$

$$V_{a2}(K\alpha) = C \times U_s \times \sin(K\alpha)$$

These output signals are supplied to the two electronic switches 48a and 48b, which have the positions a, b, c and d. Both switches pass periodically through the positions a, b, c, d, a, b, . . . . Let the period of a cycle be $T_0$ and the dwell time per position $T_0/4$. The switches are controlled by a divider 49, which is clocked by a clock generator 50, via appropriate signals. A downstream difference amplifier 51 thus receives the following input signals in succession:

$$V_{a1}(K\alpha), V_{a2}(K\alpha), -V_{a1}(K\alpha), -V_{a2}(K\alpha).$$

This periodic signal sequence describes a staircase cosinusoidal voltage $V_t$ sampled with the sampling frequency $4/T_0$ and having the frequency $1/T_0$ and the phase $-K\alpha$; it can be represented as follows:

$$V_t = C \times V_s \times \cos(2\pi \times t/T_0 - K\alpha)$$

where=0, $T_0/4$, $2T_0/4$, $3T_0/4$ . . . .

In the difference amplifier 51 this signal is boosted by a specifiable factor—by 50, for example. The downstream filter 52, which is constructed preferably in switched-capacitor technology, generates from this a sinusoidal output signal that is compared in the phase comparator 36 with the 0° signal, which is also supplied by the divider. The downstream low-pass filter 54 carries out averaging of the pulse-duration-modulated phase measuring signal. If the phase comparator is operated with the externally supplied voltage $U_p$, then the output voltage of the low-pass filter becomes proportional to $U_p$ and the angle $K\alpha$; the result then once again is ratiometric behavior as in the case of a potentiometer, for example. The switched-capacitor filter is clocked directly by the clock generator 50.

Figure 10:
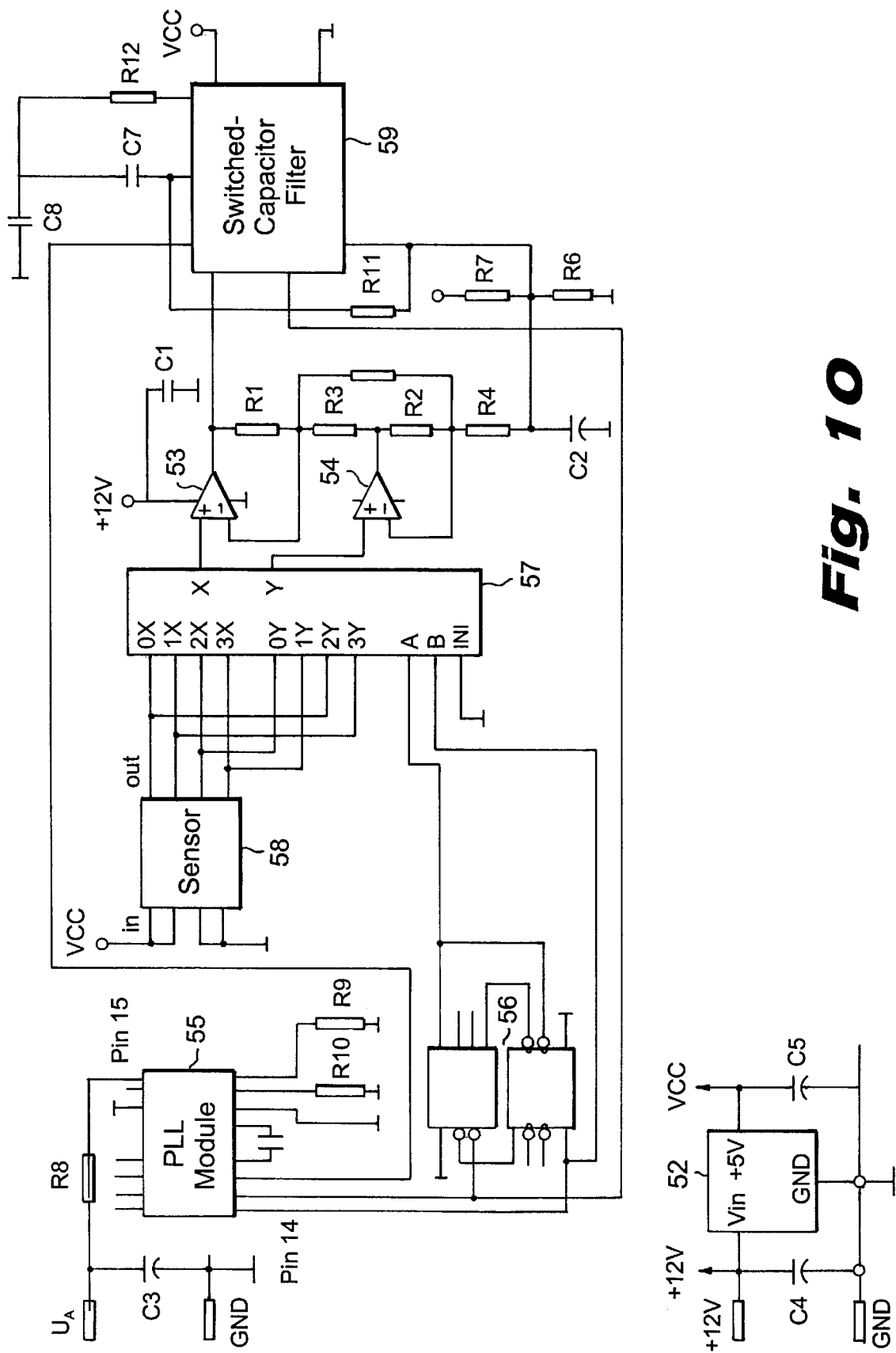

A detailed circuit example is shown in FIG. 10; its essential components are indicated in greater detail in the following. A PLL module 55 contains the oscillator, which oscillates at one megahertz. The PLL module 55 also includes the phase comparator. A frequency divider is indicated by 56 and divides first by 25 and then by 4. The outputs at pins 3 and 13 of the frequency divider thus supply a 20 Khz or 10 Khz switching signal to the two-channel multiplexer 57, to whose inputs the sensor 58 is connected, as described above. Between outputs X and Y is formed the above-mentioned staircase cosinusoidal voltage $V_t$ having the frequency 10 Khz and the sampling frequency 40 Khz; it is amplified by the difference amplifier 53 and 54. Filtering is accomplished in switched-capacitor filter 59, which is clocked at one megahertz from the oscillator. The limiting frequency of the SC filter is one megahertz/100=10 Khz.

As a result of these relationships the voltage at the filter output is purely sinusoidal. A freely available operational amplifier in the SC filter is configured as a comparator which converts the sinusoidal voltage to a square-wave voltage of the same phase. The square-wave voltage is fed to the phase comparator and compared there with the 0° signal (pin 13).

The pulse-duration-modulated output signal can be tapped at pin 15. A direct voltage $U_A$ proportional to the angle appears at the analog low-pass output.

The voltage supply of said circuit configuration is shown schematically as circuit 52.

We claim:

1. An apparatus for determining rotational position of a rotatable element without contact with the rotatable element, said apparatus comprising a sensor device having at least two sensor elements for sensing a magnetic field of magnetic field strength (B) generated by the rotatable element or influenced by rotation of the rotatable element and for producing output signals according to said magnetic field, said sensor elements having sensor outputs; and evaluation circuit means for evaluating said output signals including means for supplying said at least two sensor elements with respective alternating currents ($I_1$, $I_2$) that are 90° out of phase in accordance with formulae Ia and Ib:

$$I_1 = Io\, \cos(\omega t) \tag{Ia}$$

$$I_2 = Io\, \sin(\omega t) \tag{Ib}$$

to produce respective output voltages ($U_{H1}$, $U_{H2}$) at said sensor outputs according to formulae IIa and IIb:

$$U_{H1} = C_1 B_1 \cos(K\alpha)\, I_1(t) \tag{IIa}$$

$$U_{H2} = C_2 B_2 \sin(K\alpha)\, I_2(t) \tag{IIb}$$

wherein t is time, $\omega$ is frequency in reciprocal time units, Io is a constant and is a maximum current value for $I_1$ and $I_2$, $C_1 = C_2 = C$=another constant and $B_1 = B_2 = B$=an additional constant magnetic field strength value, such that $C_1 B_1$ and $C_2 B_2$ are maximum voltage values and are equal, $\alpha$ is an angle of rotation of the rotatable element and K is a constant such that $K\alpha$ is the phase factor;

means (23) for summing said output voltages ($U_{H1}$, $U_{H2}$) to form a sum signal; and a phase comparator (25) for producing a rotational position signal proportional to the rotational position of the rotatable element from the sum signal and said alternating current supplied to one of the at least two sensor elements.

2. The apparatus as defined in claim 1, wherein said at least two sensor elements consist of two Hall sensors (6,7).

3. The apparatus as defined in claim 2, wherein said means for producing said magnetic field is included in said rotatable element (2), said two Hall sensors (6,7) are oriented vertically and parallel to an axis of rotation of the rotatable element and are positioned with respect to the rotatable element (2) so that field lines of said magnetic field from the rotatable element extend at right angles to Hall structures of said Hall sensors defined by a current direction of the alternating currents supplied to said Hall sensors (6,7) in any rotational position of said rotatable element so that directional components of said field lines resulting from a change in said rotational position of said rotational element can be determined in said evaluation circuit means.

4. The apparatus as defined in claim 3, wherein said two Hall sensors (6,7) are offset by 90° in said sensor device so that said output voltages ($U_{H1}, U_{H2}$) are arranged in a plane extending at right angles to said axis of rotation and each of said output voltages detects ones of said directional components of said field lines differing by 90°.

5. The apparatus as defined in claim 4, wherein the rotatable element is a rotational shaft (1) including a permanent magnet (2) positioned rotationally symmetrically on an end of the rotatable element adjacent the sensor device so that said output voltages ($U_{H1}, U_{H2}$) at said sensor outputs are given by formulae 1 and 2:

$$U_{H1} = C_1 I_1(t) B \cos(\alpha) \qquad (1)$$

$$U_{H2} = C_2 I_2(t) B \sin(\alpha) \qquad (2),$$

wherein said $U_{H2}$ is offset by 90° from $U_{H1}$, said $C_1 = C_2$ and $C_1$ and $C_2$ are material constants for the Hall sensors and B is a magnetic field strength value perpendicular to a plane of the Hall sensors when said field strength is the same at both of said Hall sensors.

6. The apparatus as defined in claim 2, further comprising a micromechanically machinable semiconductor wafer including said Hall sensors (6,7) and at least a part of said evaluation circuit means integrated therein, wherein said Hall sensors are arranged so that a wafer plane of the semiconductor wafer is at right angles to an axis of rotation of the rotatable element and so that a current flow direction of said alternating currents in said semiconductor wafers is vertical to the wafer plane.

7. The apparatus as defined in claim 6, wherein said semiconductor wafer is made of silicon.

8. The apparatus as defined in claim 1, wherein said at least two sensor elements consist of two AMR sensors offset rotationally by 45°.

9. The apparatus as defined in claim 8, further comprising means for determining said rotational position according to formula (3)

$$K\alpha = \arctan(U_{H1}/U_{H2}) \qquad (3).$$

10. The apparatus as defined in claim 9, further comprising a micromechanically machinable semiconductor wafer including said AMR sensors and at least a part of said evaluation circuit means integrated therein, wherein said AMR sensors are arranged so that a wafer plane of the semiconductor wafer is at right angles to an axis of rotation of the rotatable element and so that a current flow direction of said alternating currents in said semiconductor wafers is vertical to the wafer plane.

11. The apparatus as defined in claim 1, wherein said rotatable element is a shaft of a motor vehicle.

12. An apparatus for determining rotational position of a rotatable element without contact with the rotatable element, said apparatus comprising a sensor device having two sensor elements (30,31) for sensing a magnetic field of magnetic field strength (B) generated by the rotatable element or influenced by rotation of the rotatable element and for producing sensor output signals according to said magnetic field, said sensor elements having sensor outputs at which said sensor output signals appear; and evaluation circuit means for evaluating said output signals including means (28,29) for supplying said two sensor elements with respective rectangular currents having an angular frequency (ω), pulse duty factors of 50% and phase differences of one-fourth of a period, to produce respective output voltages at said sensor outputs;

means (32,33) for amplifying said output voltages to form amplified output voltages;

means (34) for summing said amplified output voltages to form a sum signal;

means (35) for filtering the sum signal to form a filtered sum signal; and a phase comparator (36) for producing a rotational position signal according to the rotational position of the rotatable element from the filtered sum signal and said rectangular current supplied to one of the two sensor elements.

13. The apparatus as defined in claim 12, wherein said means (28,29) for supplying said two sensor elements with respective rectangular currents comprise two delay flipflops and a clock generator and said two sensors are AMR sensors or Hall sensors.

14. An apparatus for determining rotational position of a rotatable element without contact with the rotatable element, said apparatus comprising a sensor device having two sensor elements (30,31) for sensing a magnetic field of magnetic field strength (B) generated by the rotatable element or influenced by rotation of the rotatable element and for producing sensor output signals according to said magnetic field, said sensor elements having sensor outputs at which said sensor output signals appear; and evaluation circuit means for evaluating said output signals including means (28,29) for triggering said two sensor elements with a direct voltage ($V_s$) to produce respective output voltages ($U_{a1}, U_{a2}$) at said sensor outputs given by formulae IVa and IVb:

$$U_{a1}(K\alpha) = C V_s \cos(K\alpha) \qquad (IVa)$$

$$U_{a2}(K\alpha) = C V_s \sin(K\alpha) \qquad (IVb);$$

wherein is an angle of rotation of the rotatable element, K is constant such that K is the phase factor and C is another constant;

means (51) for amplifying a difference between said respective output voltages ($U_{a1}, U_{a2}$) to form an amplified difference signal, said means for amplifying having respective inputs connected to respective switch terminals;

means (48a, 48b, 50, 49) for periodically alternately switching said respective output voltages ($U_{a1}, U_{a2}$) between said respective switch terminals;

means (52) for filtering the amplified difference signal to form a filtered difference signal; and a phase comparator (36) for producing a rotational position signal according to the rotational position of the rotatable element from the filtered difference signal and a switching signal supplied by said means for switching said respective output voltages.

15. The apparatus as defined in claim 14, wherein said means (52) for filtering comprise switched-capacitor filters.

16. The apparatus as defined in claim 14, wherein said means (48a, 48b, 50, 49) for periodically switching said respective output voltages (Ua1, Ua2) comprise electronic switches (48a, 48b) controlled by a divider circuit (49) clocked by a clock generator (50).

* * * * *